United States Patent [19]
Reay

[11] Patent Number: 5,485,024
[45] Date of Patent: Jan. 16, 1996

[54] ELECTROSTATIC DISCHARGE CIRCUIT

[75] Inventor: Robert L. Reay, Mountain View, Calif.

[73] Assignee: Linear Technology Corporation, Milpitas, Calif.

[21] Appl. No.: 175,991

[22] Filed: Dec. 30, 1993

[51] Int. Cl.⁶ .......................... H01L 29/74; H01L 31/111
[52] U.S. Cl. .......................... 257/173; 257/154; 257/162; 257/165; 257/169; 257/174; 257/175; 257/358; 257/361; 257/362; 257/363; 257/575; 257/577; 257/579
[58] Field of Search .................... 257/154, 162, 257/164, 165, 169, 173, 174, 175, 358, 361, 362, 363, 575, 577, 579

[56] References Cited

U.S. PATENT DOCUMENTS

| | | | |
|---|---|---|---|
| 4,633,283 | 12/1986 | Avery | 257/173 |
| 4,897,774 | 1/1990 | Bingham et al. | 363/61 |
| 5,285,100 | 2/1994 | Byatt | 257/173 |

FOREIGN PATENT DOCUMENTS

| | | | |
|---|---|---|---|
| 0488340 | 6/1992 | European Pat. Off. | 257/173 |

OTHER PUBLICATIONS

Goldtharp et al., "An Integrated Circuit Composite PNPN diode", pp. 180–183, IEEE, 1979.
R. Vinsant, "Latch Up Protection of CMOS ICs," Teledyne Semiconductor CMOS Application Note 31, undated.

Primary Examiner—Ngân V. Ngô
Attorney, Agent, or Firm—Fish & Neave; Mark D. Rowland; Joseph M. Guiliano

[57] ABSTRACT

An ESD protection circuit which provides protection for CMOS devices against ESD potentials of up to about 10 kV is provided. The ESD protection circuit is able to provide protection against both positive-going and negative-going high energy electrical transients, and is able to maintain a high impedance state when driven to a voltage beyond the supply rails of CMOS integrated circuit, but less than tile breakdown voltage of the ESD protection circuit. The ESD protection circuit routes currents associated with ESD potentials to a predetermined arbitrary point which may be selected during the fabrication process to meet the needs of a particular application. The structure of the ESD protection circuit permits the holding current to be adjusted to accommodate the current capacity of various external circuits.

14 Claims, 9 Drawing Sheets

ELECTROSTATIC DISCHARGE CIRCUIT

BACKGROUND OF THE INVENTION

The present invention relates to CMOS devices and particularly to an electrostatic discharge (ESD) circuit for protecting CMOS devices from positive-going and negative-going high energy electrical transients. More particularly, the present invention relates to an ESD protection circuit which provides protection against large ESD transients and which allows for convenient adjustment of holding current and routing of ESD current through an arbitrary point other than the CMOS substrate.

CMOS devices are commonly used to implement logic functions in electronics applications and in particular, computer applications. Although the use of CMOS devices has become commonplace in the computer industry, there are certain concerns that need to be taken into account in order to ensure proper long-term functioning of components which incorporate these devices. One area of concern in particular relates to the handling of ESD potentials which may be applied to terminals of an integrated circuit containing CMOS devices.

ESD potentials can often be several orders of magnitude larger than signals which would ordinarily be applied to a CMOS device. Indeed, ESD potentials on the order of several kilovolts, even as high as 10 kV, are not uncommon. When such extraordinarily high ESD potentials are applied to a CMOS device, it is not surprising that severe damage to the CMOS device can occur. Typically, the damage to CMOS devices caused by ESD potentials is the result of a breakdown of the oxide layer of the integrated circuit (IC) in the vicinity of the gate of a CMOS device. The breakdown voltage of the oxide layer is a function of its thickness. A general rule of thumb is that conventional oxide in CMOS devices should be able to withstand a potential difference of approximately 70 V per 1,000 Å of oxide layer thickness. For a typical CMOS device with a gate oxide thickness of 500 Å, this translates to a maximum "safe" potential difference of about 35 V across the gate oxide. Because ESD potentials applied to a terminal of an integrated circuit can greatly exceed this breakdown voltage, integrated circuits incorporating CMOS devices are at risk of damage if an internal voltage charge is not provided.

One approach that has been taken for providing ESD protection to CMOS devices involves fabricating ESD cells in conjunction with the fabrication of the CMOS devices. Some of these ESD cells form four-layer devices (such as silicon-controlled rectifiers or "SCRs") which transition from a high impedance state to a low impedance state when an ESD potential appears at a terminal of the CMOS IC protected by the ESD cell. In the high impedance state, the ESD cell allows the CMOS devices in the IC to experience normal potentials which are necessary for the CMOS devices to perform their intended function. However, when the potential applied to the protected terminal exceeds a predetermined threshold value (referred to herein as the breakdown voltage of the ESD cell) beyond the normal operating range of the terminal, the ESD cell begins to conduct current, thereby acting as a current source or sink for the current associated with the ESD potential. Such ESD cells are capable of discharging the ESD potential with very little power dissipation, so that not only are the CMOS devices protected, but the ESD cell also goes undamaged.

However, known examples of SCR-based ESD cells such as those described above have not addressed certain difficulties which may present themselves depending upon the intended application for the CMOS devices. For example, the known SCR-based ESD cells route the current associated with the ESD potential to the substrate of the CMOS IC. While this ordinarily has had no adverse effect on the CMOS ICs in which the ESD cells were used, it may nevertheless be undesirable in certain IC designs to direct the current to the CMOS substrate. Indeed, in some IC designs, the substrate may not even be connected to a pin through which the current can be routed. It would therefore be desirable to be able to route the current associated with an ESD potential to an arbitrary point, depending on the needs of a particular application. For many applications, an ideal point would be a circuit path (other than the substrate) electrically connected to an external ground.

An additional drawback relates to the manner which known SCR-based ESD cells are able to discharge the ESD potential without dissipating a significant amount of power. As previously described, an ESD potential exceeding the breakdown voltage of the ESD cell will cause the ESD cell to conduct current. When a threshold level of current flows through the ESD cell, the ESD cell enters a low impedance state which causes the voltage across the four-layered device to rapidly and substantially decline. Since power is the product of voltage and current, the ESD cell is able to discharge the ESD potential without dissipating a significant amount of power by virtue of the fact that the voltage is brought down to extremely low levels. Once the ESD event is over, the ESD cell normally returns to its high impedance state, thereby allowing the protected CMOS devices to experience normal operating potentials.

However, if an external circuit (e.g., a driver) capable of sourcing or sinking a current greater than another threshold level (known as the "holding current") is connected to a protected pin of the CMOS IC at a time when an ESD event occurs, the ESD cell may enter a "quasi-latch-up" condition. When this occurs, the ESD cell fails to reenter its high impedance state following the end of the ESD event, and may prevent CMOS devices in the IC from resuming normal operation. It would therefore be desirable to provide an apparatus for, and a method of fabricating, an ESD cell which allows for adjustment of the holding current on an application specific basis so as to accommodate otherwise normal currents provided by external circuits.

SUMMARY OF THE INVENTION

The present invention provides improved ESD protection for a CMOS circuit. The ESD protection circuit of the present invention can be implemented to provide many of the advantages offered by known SCR-based ESD protection circuits. For example, the ESD protection circuit of the present invention can be implemented to provide protection against ESD potentials of up to about 10 kV in either the positive-going or negative-going direction. In addition, the ESD protection circuit of the present invention can be implemented such that it is capable of maintaining a high impedance state when driven to a voltage beyond the supply rails of the protected CMOS IC but less than the breakdown voltage of the ESD protection circuit.

In addition, the apparatus and methods of the present invention overcome certain difficulties which have yet to be addressed by known SCR-based ESD protection circuits. For example, in one described embodiment, the ESD protection circuit of the present invention is fabricated in a floating n-well, as opposed to the substrate of the CMOS IC. This allows the current associated with the ESD potential to be directed to an arbitrary point depending on the needs of a particular application, including a circuit path connected to an external reference potential such as ground. The ESD protection circuit of the present invention also may be fabricated in a floating p-well. Thus, the ESD protection circuit of the present invention can be used in situations where it is undesirable to route the ESD current to the CMOS substrate, and particularly in situations where there is no pin connection to the CMOS substrate.

The apparatus and methods of the present invention further provide a convenient way of controlling the holding current of the ESD protection circuit. More precisely, in an exemplary embodiment fabricated in an n-well, the holding current of the ESD protection circuit is made adjustable by providing a number of discrete p+ implants in the p-base implant region during the fabrication process. By selectively connecting the p+ implants in various combinations to an output terminal of the ESD protection circuit using different metal masks, the holding current can be adjusted as desired to suit different applications. By increasing the number of p+ implants connected, the holding current can be increased to accommodate external drivers having a high current capacity. Thus, the number of connected p+ implants can be selected to provide a holding current that is greater than the maximum current expected from the external drivers under normal operating conditions. In this manner, the ESD protection circuit of the present invention is able to avoid a quasi-latch-up condition. The ESD protection circuit of the present invention therefore improves the overall operating performance of the CMOS IC while providing protection against positive-going and negative-going high energy electrical transients.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
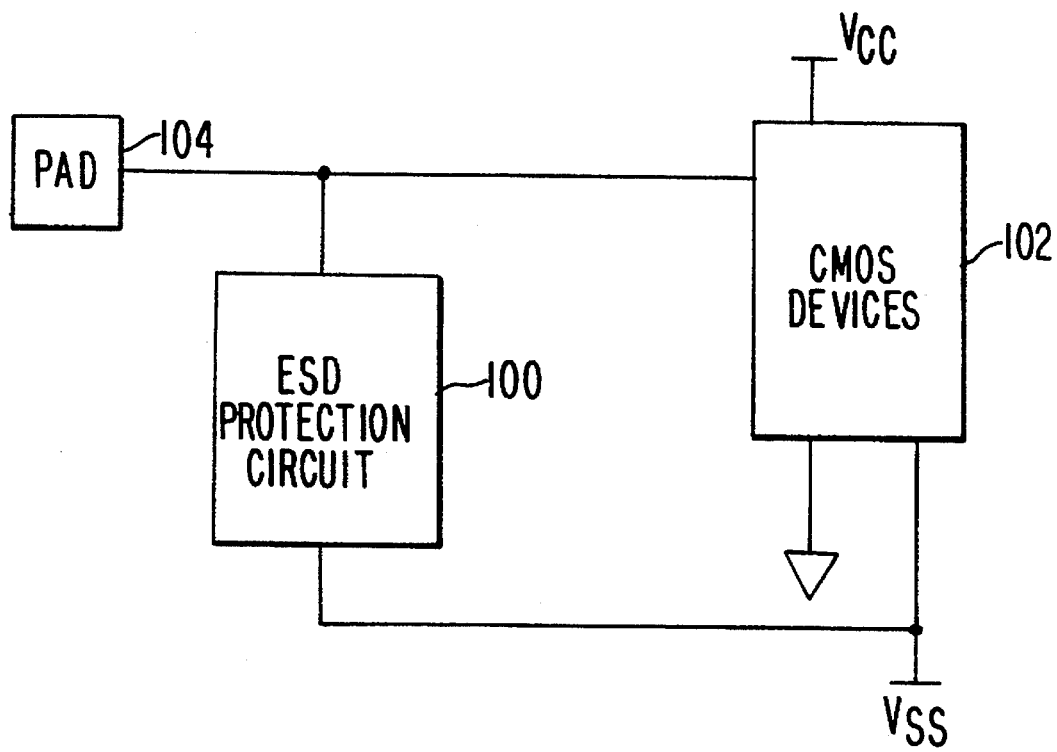
FIG. 1 is a block diagram representing a known prior art ESD protection circuit which routes currents associated with ESD potentials to the substrate of a CMOS IC.

Before describing the ESD protection circuit of the present invention, a prior art ESD protection circuit is described so that the features and advantages of the present invention may be better understood. Referring first to FIG. 1, a simplified block diagram is shown depicting an arrangement by which a prior art ESD protection circuit 100 incorporated in a CMOS integrated circuit with CMOS devices 102 protects the CMOS devices 102 from ESD potentials (either positive-going or negative-going) which may appear at an input bonding pad 104 of the CMOS IC. Under normal operating conditions, the CMOS devices 102 respond to moderate potentials (typically on the order of a few volts) which appear at the input bonding pad 104 in order to perform an intended function (the particular function not being pertinent to the present invention). These moderate potentials may be supplied, for example, by an external driver (not shown). However, unexpectedly large potentials such as ESD potentials may occasionally appear at the input bonding pad 104 and thus create large gate-substrate voltages in CMOS devices having a gate coupled to the input bonding pad 104. ESD potentials which cause potential differences exceeding 35 V across the gate oxide of a CMOS device can cause serious damage to the device, so the ESD protection circuit 100 is provided to limit potential differences between the input bonding pad 104 and the substrate of the integrated circuit (the potential of which is represented in FIG. 1 as $V_{ss}$).

One drawback apparent from FIG. 1 is that the ESD protection circuit 100 sinks the current associated with the ESD potential to the substrate of the CMOS IC. Discharging the ESD potential into the substrate of the CMOS IC will not ordinarily lead to damage; however, it is not often desirable in certain applications to route the ESD current to the substrate. Indeed there may not even be a pin connection to the CMOS substrate through which the ESD potential can be discharged. As explained below, one feature of the ESD protection circuit of the present invention is that ESD potentials can be discharged to an arbitrary point in the circuit other than the substrate.

Figure 2B:
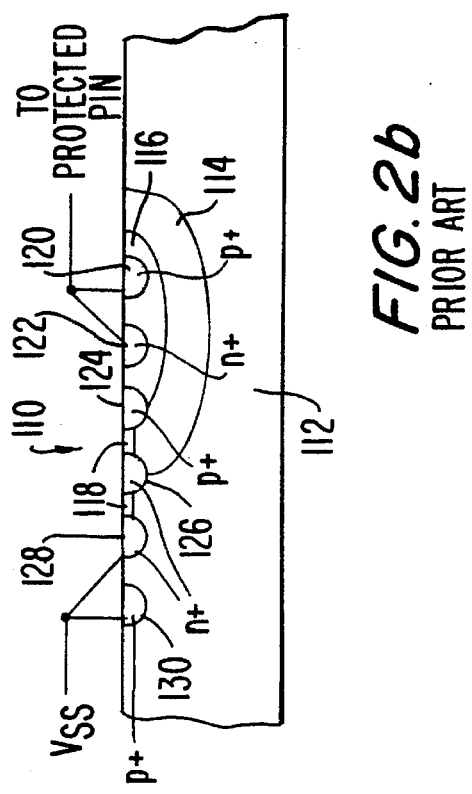
FIGS. 2a and 2b are, respectively, a top view and a sectional view of the prior art ESD protection circuit shown in FIG. 1.
Figure 2A:
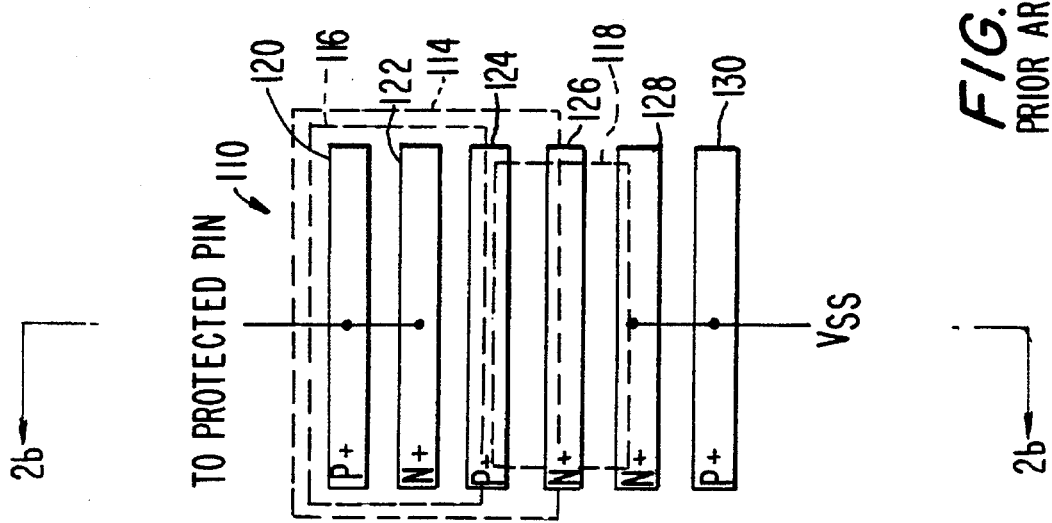

FIGS. 2a and 2b illustrate the structure of one known prior art embodiment of an ESD cell 110 configured to route ESD current to the substrate in the manner shown more generally by the ESD protection circuit 100 of FIG. 1. The ESD cell 110 is manufactured in conjunction with the CMOS device or devices (such as the CMOS devices 102 of FIG. 1) which the ESD cell 110 is intended to protect. These devices may be conventionally fabricated using a mask sequence that includes a series of mask steps and corresponding process steps. The ESD cell 110 is formed on a p-doped silicon substrate 112. Within the substrate 112 is formed an n-well implant 114 which has a concentration of n-type dopant that is greater than the concentration of p-type dopant in the substrate 112. Within the n-well implant 114 is formed a p-base implant 116. The p-base implant 116 is a region having a relatively high concentration of p-type dopant. Extending from a point on the surface of the n-well implant 114 to a point on the surface of the substrate 112 is formed a p-field 118. The concentration of p-type dopant in the p-field determines the potential at which the ESD cell 110 experiences "breakdown." As explained in greater detail below, when the ESD cell 110 breaks down, it transitions from a non-conducting state to a conducting state necessary to shunt current associated with an ESD potential. Typically the p-type dopant concentration of the p-field 118 is regulated such that the breakdown voltage of the ESD cell 110 is about 24 V.

The prior art ESD cell 110 also requires formation of a series of n+ and p+ implant regions. Within the p-base implant 116 is formed a p+ implant 120 and an n+ implant 122. Another p+ implant 124 is created which straddles the p-base implant 116 and the n-well implant 114 and in addition contacts one end of the p-field 118. Another n+ implant 126 is formed within the p-field 118, straddling the n-well implant 114 and the substrate 112. Two other implants, an n+ implant 128 and a p+ implant 130, are formed within the substrate 112. The n+ implant 128 contacts one end of the p-field 118. The pin that is intended to be protected from ESD potentials (e.g., the input bonding pad 104 of FIG. 1) is connected to the p+ implant 120 and the n+ implant 122. The n+ implant 128 and the p+ implant 130 are connected to $V_{ss}$ which, as described above, serves as a source or sink (depending on the polarity of the ESD potential) for high currents associated with ESD potentials discharged by the prior art ESD cell 110.

Figure 3:
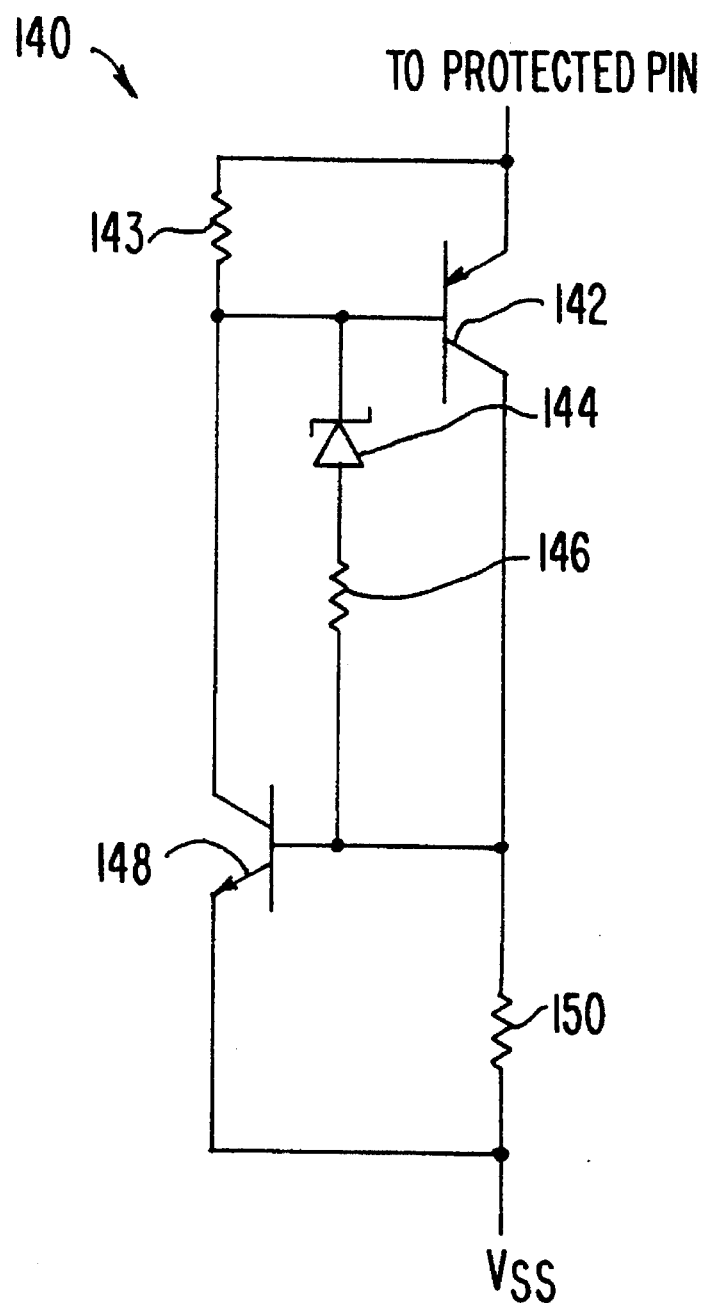
FIG. 3 is a schematic diagram of a four-layer device provided by the prior art ESD protection circuit shown in FIGS. 2a and 2b.

Turning now to FIG. 3, and with continued reference to FIGS. 2a and 2b, a schematic diagram of a silicon-controlled rectifier (SCR) 140 formed in the prior art ESD cell 110 is described. Although one SCR 140 is shown in FIG. 3, those of ordinary skill in the art will appreciate that, in fact, two SCRs are provided by the ESD cell 110. For purposes of this discussion, the action of only one SCR 140 is described in connection with protection for positive-going ESD potentials, it being understood that similar principles apply to a second SCR formed in the ESD cell 110 for protection of negative-going high energy electrical transients.

For positive-going ESD potentials, the SCR 140 includes a pnp transistor 142 having an emitter coupled to the pin intended to be protected from ESD potentials. The emitter of the transistor 142 is provided by the combination of the p+ implant 120 and the p-base implant 116. The base of the transistor 142 is provided by the n-well implant 114, and its collector is provided by the substrate 112. The n-well implant 114 also provides a resistor 143 coupled between the protected pin and the base of the transistor 142.

The n-well implant 114 is electrically shorted to the n+ implant 126, thereby forming the cathode of a zener diode 144 which is coupled to the base of the transistor 142. The anode of the zener diode 144 is the p-field 118. The p-field 118 also forms a resistor 146 which is coupled between the anode of the zener diode 144 and the base of an npn transistor 148. The base of the transistor 148 is formed by the substrate 112, which also serves to provide a resistor 150. The collector of the transistor 148 is provided by the n-well implant 114, and is coupled to the base of the transistor 142. The n+ implant 128 forms the emitter of the transistor 148.

FIG. 3 also shows that the end of resistor 150 opposite to the end coupled to the base of the transistor 148 is connected to $V_{ss}$. This demonstrates that in this prior art scheme, it is necessary for the substrate 112 to serve as the current sink for high currents associated with positive-going ESD potentials. For negative going ESD potentials the substrate 112 likewise serves as the current source for the ESD current. As explained above, for some applications these circumstances may not be desirable, and indeed, there may not even be a pin connected to the substrate to route the ESD current to be conducted by the SCR 140.

Figure 4:
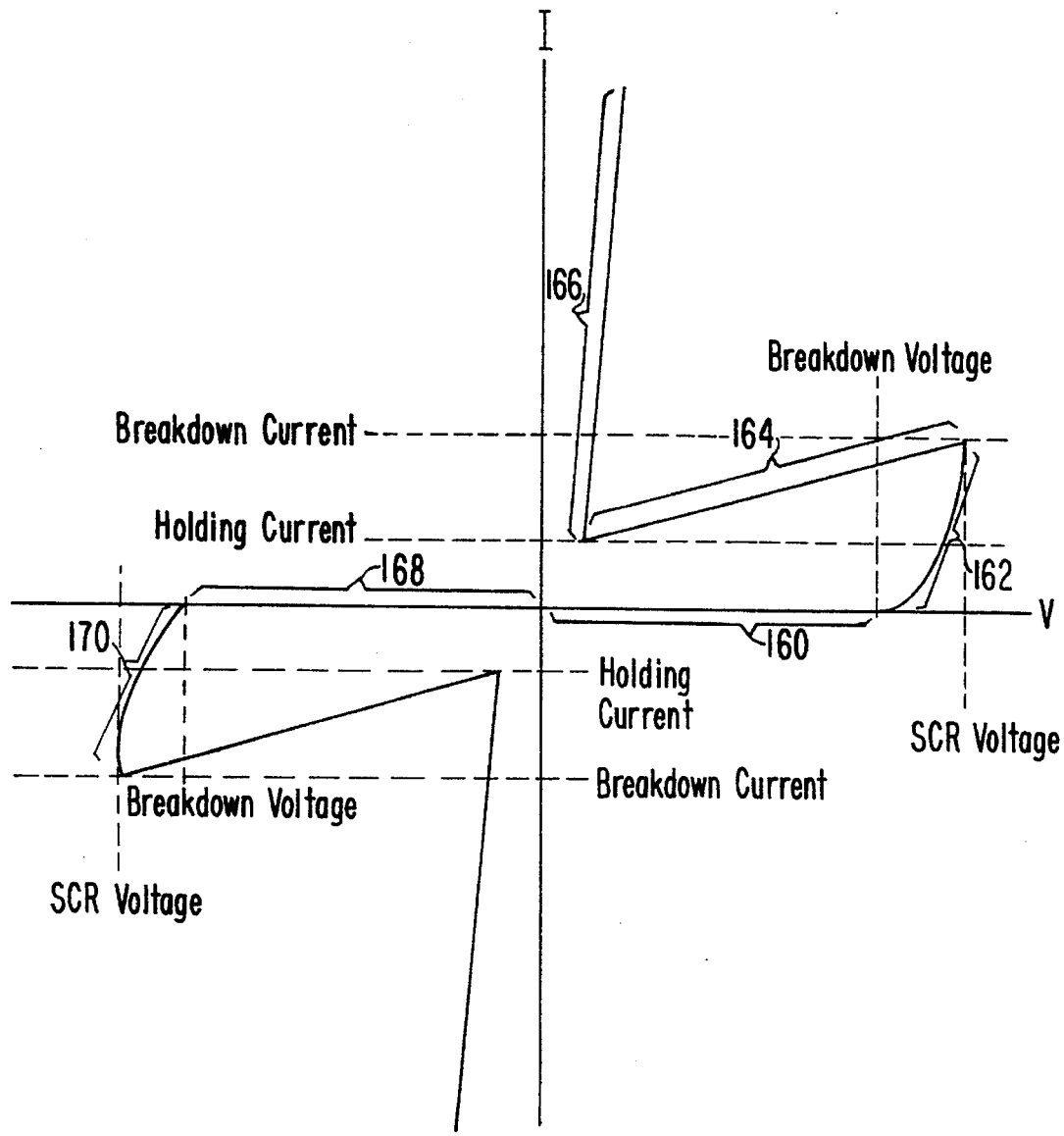
FIG. 4 is a curve trace representing the operational characteristics of an ESD protection circuit which is capable of providing protection against negative-going and positive-going high energy electrical transients.

The way in which the SCR 140 operates to discharge energy associated with positive-going ESD potentials may be understood by reference to the curve trace shown in FIG. 4 and with continued reference to FIG. 3. When the protected pin is brought to a potential higher than $V_{ss}$, the cathode of the zener diode 144 is pulled high. As the potential applied to the protected pin increases, the voltage across the zener diode 144 also increases until its breakdown voltage is reached. Segment 160 of the curve trace depicts the action of the SCR 140 until the voltage across the zener diode 144 reaches its breakdown voltage. Essentially, as the potential applied to the protected pin increases, no appreciable current flows through the circuit because of the blocking action of the zener diode 144 and because the transistors 142 and 148 are non-conducting. Typically, the SCR 140 is designed so that the zener diode 144 has a breakdown voltage of about 24 V.

Once the breakdown voltage of the zener diode 144 is reached, segment 162 of the curve trace shows that current starts to flow through the resistors 143, 146 and 150, and that the amount of current flowing significantly increases with increasing potential applied to the protected pin. The voltage across the SCR 140 increases until a point referred to as the "SCR voltage" is reached, at which time sufficient current (referred to as the "breakdown current") flows through the resistors 143 and 150 to cause the transistors 142 and 148 to begin to conduct. As the transistors 142 and 148 become more conductive, the voltage across the SCR 140 "snaps back" to a very low level, as indicated by segment 164. The current also drops from the breakdown current to a level referred to as the "holding current." As long as a current exceeding the holding current continues to flow, the SCR 140 is maintained in a low impedance state and the potential across the SCR 140 is kept low. Therefore, the SCR 140 can sink very large currents associated with ESD potentials applied to the protected pin with very little power dissipation. The curve trace of FIG. 4 also depicts the action of another SCR (not shown) which, as described above, is also provided by the ESD cell 110 (FIGS. 2a and 2b) to discharge negative-going electrical transients.

It has been previously explained that one drawback associated with prior art ESD protection schemes described above in connection with FIGS. 1–3 is that the high currents associated with ESD potentials must be routed to the substrate 112 (FIGS. 2a and 2b). Another drawback relates to the holding current—prior art ESD protection circuits do not provide a convenient way for adjusting the holding current to meet the needs of a particular application. The reason why the holding current is not easily adjusted in prior art ESD cells is that the resistor 150 of the SCR 140 is the resistance of the substrate 112, which is not easily controlled.

In some instances, the inability to select the holding current on an application specific basis can lead to a "quasi-latch-up" condition if an external driver connected to the protected pin is sourcing current when an ESD event occurs.

The quasi-latch-up condition may be easily understood by referring again to FIG. 4. Segment 160 of the curve trace represents the region in which the SCR 140 remains in a high impedance state. As long as the voltage across the zener diode 144 does not exceed the breakdown voltage, then no appreciable current flows through the circuit. It is in this region that it is expected that any current flowing from the protected pin is intended to be received by the CMOS devices (e.g., the CMOS devices 102 of FIG. 1). However, if an ESD potential appears at the protected pin while an external driver is operating in an otherwise normal fashion, the SCR 140 will snap back to its low impedance state to discharge the ESD potential without dissipating a large amount of power (as desired). When the ESD event is over, under normal circumstances, the potential across the resistor 150 will fall below that necessary to keep the transistor 148 in the conducting state, thereby returning the SCR 140 to its high impedance state. But when an external driver continues to source an otherwise desirable current that exceeds the holding current after the ESD event is over, the SCR 140 never has an opportunity to return to its high impedance state and therefore the current associated with the potential applied by the external driver is channeled away from the CMOS devices through the SCR 140. This condition may have an undesirable effect on the operation of the CMOS devices which the ESD protection circuit is intended to protect.

Figure 5:
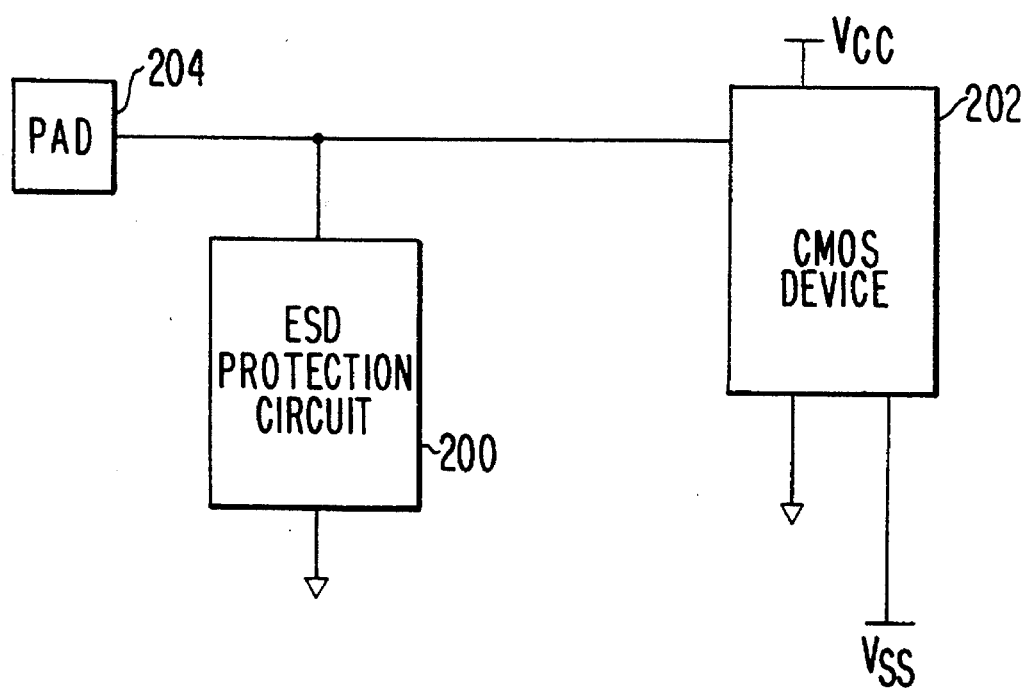
FIG. 5 is a block diagram representing an ESD protection circuit in accordance with the principles of the present invention.

Referring now to FIG. 5, a simplified block diagram is shown depicting an arrangement by which an ESD protection circuit 200 in accordance with the principles of the present invention protects CMOS devices 202 from unacceptably large ESD potentials (either positive-going or negative-going) which may appear at an input bonding pad 204. The ESD protection circuit 200 is able to perform the protective functions provided by the ESD protection circuit 100 (FIG. 1) while overcoming the drawbacks described in connection therewith. In particular, the ESD protection circuit 200 remains in a non-conducting state when moderate potentials are applied to the input bonding pad 204, but transitions to a low impedance conducting state when a large potential, such as an ESD potential, appears at the input bonding pad 104. When current conducted by the ESD protection circuit 200 reaches the holding current, the circuit enters a low impedance state, and is able to discharge an ESD potential of up to about 10 kV applied to the input bonding pad 204 without dissipating a significant amount of power.

One difference between circuits 100 and 200 that is readily apparent from an inspection of FIG. 5 is that the ESD protection circuit 200 avoids the need to route currents associated with ESD potentials to the substrate on which the CMOS devices 202 are formed. Thus, the ESD protection circuit 200 of the present invention is advantageously suitable for use in applications where it is undesirable to use the substrate as a sink or source for ESD current. And it is especially advantageous in situations where there is no pin connected to the substrate of the CMOS IC through which the current associated with the ESD potential can be routed. As explained in greater detail below, the present invention provides the ability to route currents associated with ESD potentials to an arbitrary point.

Referring now to FIGS. 6a and 6b, an ESD cell 210 in accordance with the principles of the present invention is described which is suitable for use as the ESD protection circuit 200 of FIG. 1. However, so that the invention may be more easily understood, the ESD cell 210 described in connection with FIGS. 6a and 6b is implemented so as to be capable of discharging only one polarity of ESD potentials. Two such cells parallel connected input-to-output and output-to-input could be used to provide protection in two directions. An ESD cell that is capable of discharging positive-going and negative-going high energy transients is described below in connection with FIGS. 8a and 8b.

The ESD cell 210 is manufactured in conjunction with the CMOS devices (such as the CMOS devices 202 of FIG. 5) which the ESD cell 210 is intended to protect. Similar to the process described in connection with FIGS. 2a and 2b, these devices may be conventionally fabricated using a mask sequence that includes a series of mask steps and corresponding process steps. Rather than being formed directly in the substrate (as was the case for the prior art ESD cell described above), the ESD cell 210 is formed in an n-well implant 212 which in turn is formed in a p-doped silicon substrate 214. The n-well implant 212 has a concentration of n-type dopant that is greater than the concentration of p-type dopant in the substrate 214. Within the n-well implant 212 is formed a p-base implant 216. The p-base implant 216 is formed with sufficient p-type dopant to achieve a p-base sheet resistance of about 900 $\Omega$/square. Also formed within the n-well implant 212 is a p-field 218 which contacts at one end the p-base implant 216. The concentration of p-type dopant in the p-field determines the potential at which the ESD cell 210 breaks down, and is generally within a range between the concentrations of the substrate and the p-base (as is also true of the p-field in prior art ESD cell 110). As explained above, when breakdown occurs the ESD cell 210 transitions from its non-conducting state to a conducting state to sink the high current associated with an ESD potential. In a preferred embodiment, the p-type dopant concentration of the p-field 218 is regulated such that the breakdown voltage of the ESD cell 210 is about 20 V.

The ESD cell 210 also includes a plurality of discrete n+ and p+ implant regions. Within the n-well implant 212 is formed a p+ implant 220 which provides an ohmic contact to the protected pin (e.g., the input bonding pad 204 of FIG. 5). An n+ implant 222 is formed substantially within the p-field 218 but at its outermost edges also contacts the n-well implant 212.

Formed within the p-base implant 216 is another p+ implant 224. A plurality of smaller p+ implants, hereinafter referred to as p-fingers 226, are also formed within the p-base implant 216. The p-fingers 226 are separated by a plurality of smaller n+ implants 228. (In FIG. 6b, only the centrally located p-finger 226 is visible. The n+ implants 228 and the other p-fingers 226 are not visible in FIG. 6b, but are shown in FIG. 6a.) A metal mask pattern 230 is used to commonly couple the p-fingers 226, the n+ implants 228, and the p+ implant 224 to a second pin connection which may provide the output from the ESD cell 210. The p+ implant 224 provides an ohmic contact between the second pin connection and the p-base implant 216. Thus, by forming the ESD cell 210 in the floating n-well implant 212, the need to route high currents associated with ESD potentials to the substrate 214 is advantageously avoided. Instead, the present invention provides the opportunity to sink the high currents associated with ESD potentials to any arbitrary point, including a pin connected to an external ground. In this case, this can be accomplished by simply coupling the pin connected to the metal mask pattern 230 to an external ground connection.

Figure 6:
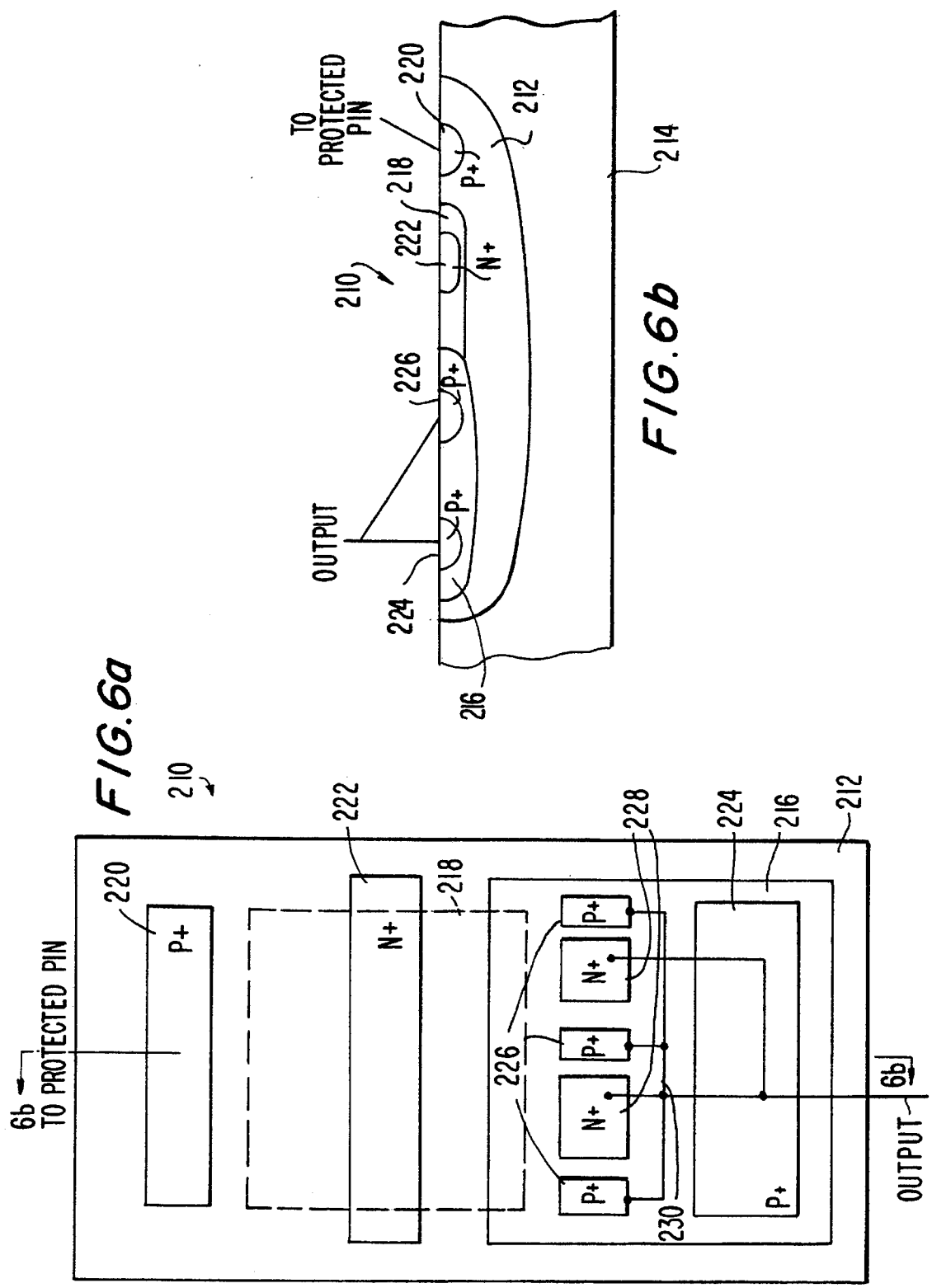
FIGS. 6a and 6b are, respectively, a top view and a sectional view of the ESD protection circuit shown in FIG. 5 in accordance with the principles of the present invention.
Figure 7:
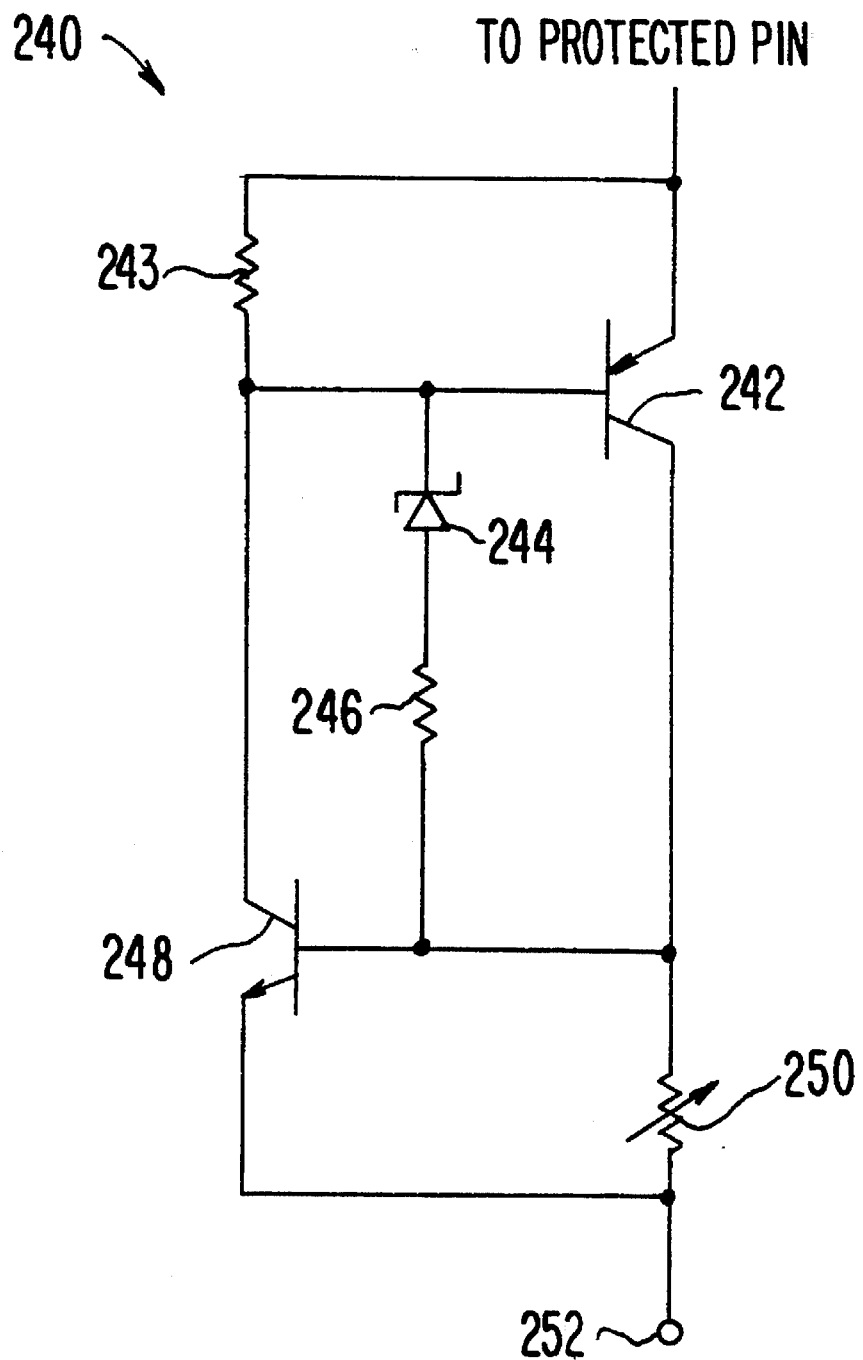
FIG. 7 is a schematic diagram of a four-layer device provided by the ESD protection circuit shown in FIGS. 6a and 6b in accordance with the principles of the present invention.

Turning now to FIG. 7, and with continued reference to FIGS. 6a and 6b, a schematic diagram of a silicon-controlled rectifier (SCR) 240 is described. The SCR 240 provides protection against positive-going ESD potentials applied to the protected pin (e.g., the input bonding pad 204 of FIG. 5).

The SCR 240 includes a pnp transistor 242 having an emitter coupled to the pin intended to be protected from ESD potentials. The emitter of the transistor 242 is provided by the p+ implant 220. The base of the transistor 242 is provided by the n-well implant 212. The n-well implant 212 also provides a resistor 243 coupled between the protected pin and the base of the transistor 242. The collector of the transistor 242 is provided by the p-base implant 216.

The n-well implant 212 is electrically shorted to the n+ implant 222 to form the cathode of a zener diode 244 which is coupled to the base of the transistor 242. The anode of the zener diode 244 is the p-field 218. The p-field 218 also forms a resistor 246 which is coupled between the anode of the zener diode 244 and the base of an npn transistor 248. The base of the transistor 248 is formed from the p-base implant 216. The n+ implants 228 in the p-base implant 216 form the emitter of the transistor 248. The collector of the transistor 248 is provided by the n-well implant 212. The p-base implant 216 also provides a resistor 250. The end of the resistor 250 opposite to the end coupled to the base of the transistor 248, and the emitter of transistor 248 are connected to an output node 252 which may be any point convenient for a particular application.

In FIG. 7, the resistor 250 is depicted as a variable resistor; however, this is not intended to convey the notion that the resistor 250 is variable after the ESD cell 210 is fabricated. Rather, the variable resistor symbol for the resistor 250 represents an important feature of the present invention—that the value of the resistor 250 can be easily adjusted during the fabrication process of the ESD cell 210. As explained in greater detail below, the ease by which the value of the resistor 250 may be adjusted allows the holding current to be varied as needed for a particular application.

Selection of a resistance value for the resistor 250 during the fabrication process of the ESD cell 210 is accomplished by choosing the number of p-fingers 226 formed in the p-base implant 216. Each p-finger 226 added to the ESD cell 210 has the effect of lowering the resistance value of the resistor 250. The reason why the value of resistor 250 is lowered is that each p-finger 226 in combination with the p-base implant 216 can be viewed as adding a parallel resistor to the resistance provided by the p-base implant 216.

In some respects, the SCR 240 operates in a manner similar to that described for the SCR 140 shown in FIG. 3. The curve trace shown in FIG. 4 also applies to the SCR 240; however, the region of the curve trace applicable to negative-going high energy electrical transients does not pertain to the embodiment shown in FIG. 7. For clarity, the operation of the SCR 240 is described completely with respect to FIG. 7 with emphasis being placed on the distinctions between the SCR 240 and the prior art SCR 140 described in connection with FIG. 3.

When the protected pin is brought to a potential higher than the output node 252 (e.g., ground), the cathode of the zener diode 244 is pulled high. As the potential applied to the protected pin increases, the voltage across the zener diode 244 also increases until its breakdown voltage is reached. Until the breakdown voltage is reached, the operation of the SCR 240 is defined by the segment 160 of the curve trace shown in FIG. 4. No appreciable current flows through the circuit until the breakdown voltage is reached. Thus, the SCR 240 maintains its high impedance state so that the CMOS devices being protected continue to experience moderate potentials applied to the protected pin.

After the breakdown voltage of the zener diode 244 is reached, segment 162 of the curve trace shown in FIG. 4 defines the operation of the SCR 240. Essentially, current starts to flow through the resistors 243, 246 and 250, and the amount of current flowing significantly increases as the potential applied to the protected pin increases. The voltage across the SCR 240 continues to increase until the SCR voltage is reached, at which time sufficient current (i.e., the breakdown current) flows through resistors 243 and 250 to cause the transistors 242 and 248 to begin to conduct. As the transistors 242 and 248 become more conductive, the voltage across the SCR 240 "snaps back," and the current drops to the holding current (as indicated by segment 164 of the curve trace shown in FIG. 4). In its low impedance state, the SCR 240 is able to discharge the ESD potential with very little power dissipation because of the snap back phenomenon described above in connection with FIG. 3 (illustrated by segment 166 of the curve trace shown in FIG. 4). As the ESD potential is discharged, the current flowing begins to fall, eventually below the holding current. At that time, the SCR 240 reenters its high impedance state to allow the protected CMOS devices to once again experience normal potentials appearing at the protected pin.

As explained above, in prior art ESD cells, the resistance corresponding to the resistor 250 is defined by the resistance of the substrate, which is not easily controlled. Thus, in the fabrication process of prior art ESD cells, it is not easy to select the holding current in accordance with a particular application. This could lead to the "quasi-latch-up" condition described earlier if an external driver connected to the protected pin can source a current greater than the holding current of the ESD cell.

The quasi-latch-up problem which may present itself from time to time in certain prior art ESD cells may be overcome by the present invention. Essentially, all that one needs to know is the maximum current that is expected from any external driver that is to be connected to the protected pin. Once that current is known, the value of the resistor 250 may be selected so that the holding current of the SCR 240 is greater than the maximum current expected from the external drivers. To lower the value of the resistor 250, additional p-fingers 226 are connected by the metal mask pattern 230. This has the effect of raising the holding current because more current will be necessary to achieve the required potential across the resistor 250 to keep the transistor 248 on. Conversely, if one wished to lower the holding current, less of the p-fingers 226 would be connected.

As previously mentioned, the ESD cell 210 described in connection with FIGS. 6a and 6b provides protection against single polarity ESD potentials only. Referring now to FIGS. 8a and 8b, an ESD cell 310 is described which provides protection against positive-going and negative-going high energy electrical transients which may appear from time to time on the protected pin. The ESD cell 310 also avoids the need to direct current to the substrate of the CMOS devices and provides the advantage of holding current control.

The ESD cell 310 may be viewed as an overlapping pair of the ESD cells 210 (FIGS. 6a and 6b) connected together with opposite connections. The ESD cell 310 is formed in an n-well implant 312 which in turn is formed in a p-doped silicon substrate 314. Instead of one p-base implant, a pair of p-base implants 316 are formed within the n-well implant 312. The p-base implants 316 are formed with sufficient p-type dopant to achieve a p-base sheet resistance of about 900 Ω/square. Also formed on the surface of the n-well implant 312 is a p-field 318 which extends between the pair of p-base implants 316 and contacts each of the p-base implants 316. As described above, the concentration of p-type dopant in the p-field 318 determines the potential at which the ESD cell 310 transitions from its non-conducting state to a conducting state to sink the high current associated with an ESD potential. In a preferred embodiment, the p-type dopant concentration of the p-field 318 is regulated such that the breakdown voltage of the ESD cell 310 is about 20 V. The ESD cell 310 also includes a plurality of discrete n+ and p+ implant regions. An n+ implant 320 is formed substantially within the p-field 318 but at its outermost edges also contacts the n-well implant 312. Within each of the p-base implants 316 is formed a p+ implant 322 (one p+ implant 322 within each p-base implant 316). The p+ implants 322 provide ohmic contacts to the protected pin and the output pin. Also formed within each of the p-base implants 316 are a plurality of p-fingers 324. The p-fingers 324 are separated by a plurality of smaller n+ implants 326. (In FIG. 8b, only the centrally located p-fingers 324 are visible. The n+ implants 326 and the other p-fingers 324 are not visible in FIG. 8b, but are shown in FIG. 8a.)

A metal mask pattern 328 is used to commonly couple the protected pin to the plurality of n+ implants 326 and the p+ implant 322 in one of the p-base implants 316. In the other p-base implant 316, a metal mask pattern 330 is used to commonly couple the p-fingers 324, the n+ implants 326 and the p+ implant 322 to the pin connection which may provide the output from the ESD cell 310.

Figure 8:
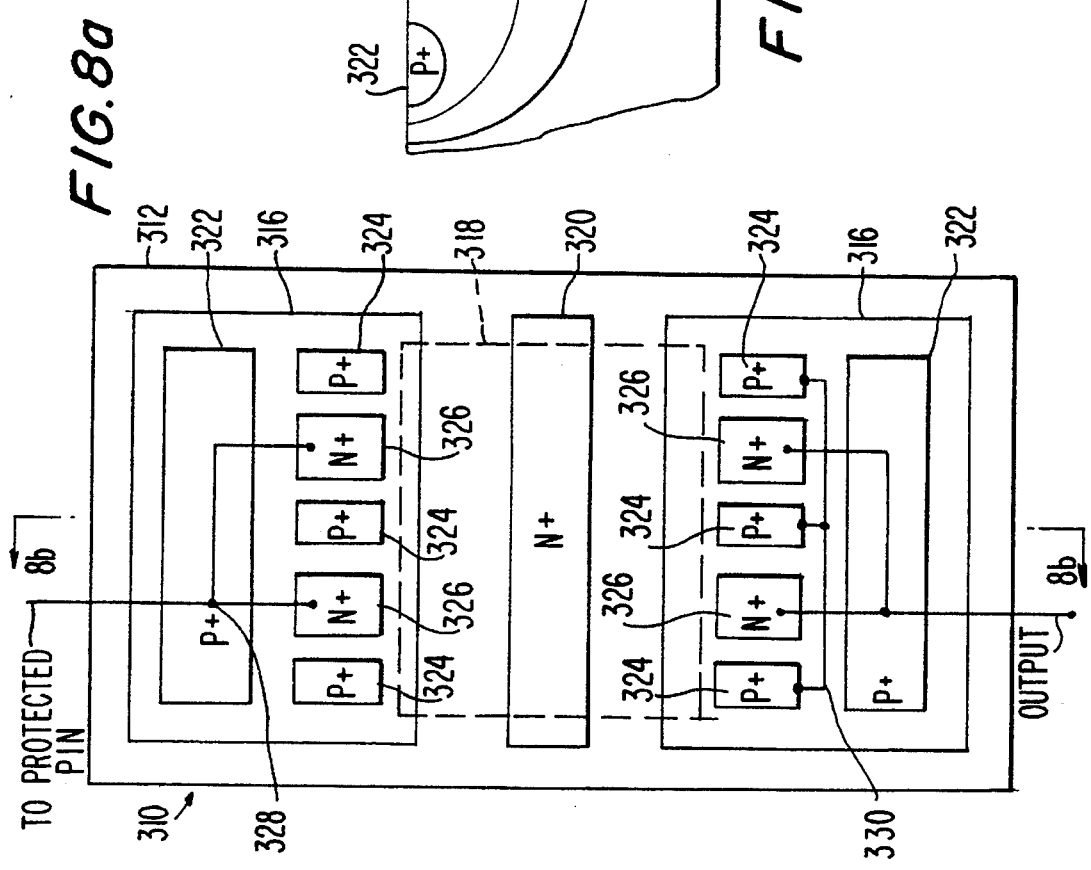
FIGS. 8a and 8b are, respectively, a top view and a sectional view of an ESD protection circuit in accordance with the principles of the present invention which is capable of providing protection against negative-going and positive-going high energy electrical transients.
Figure 9:
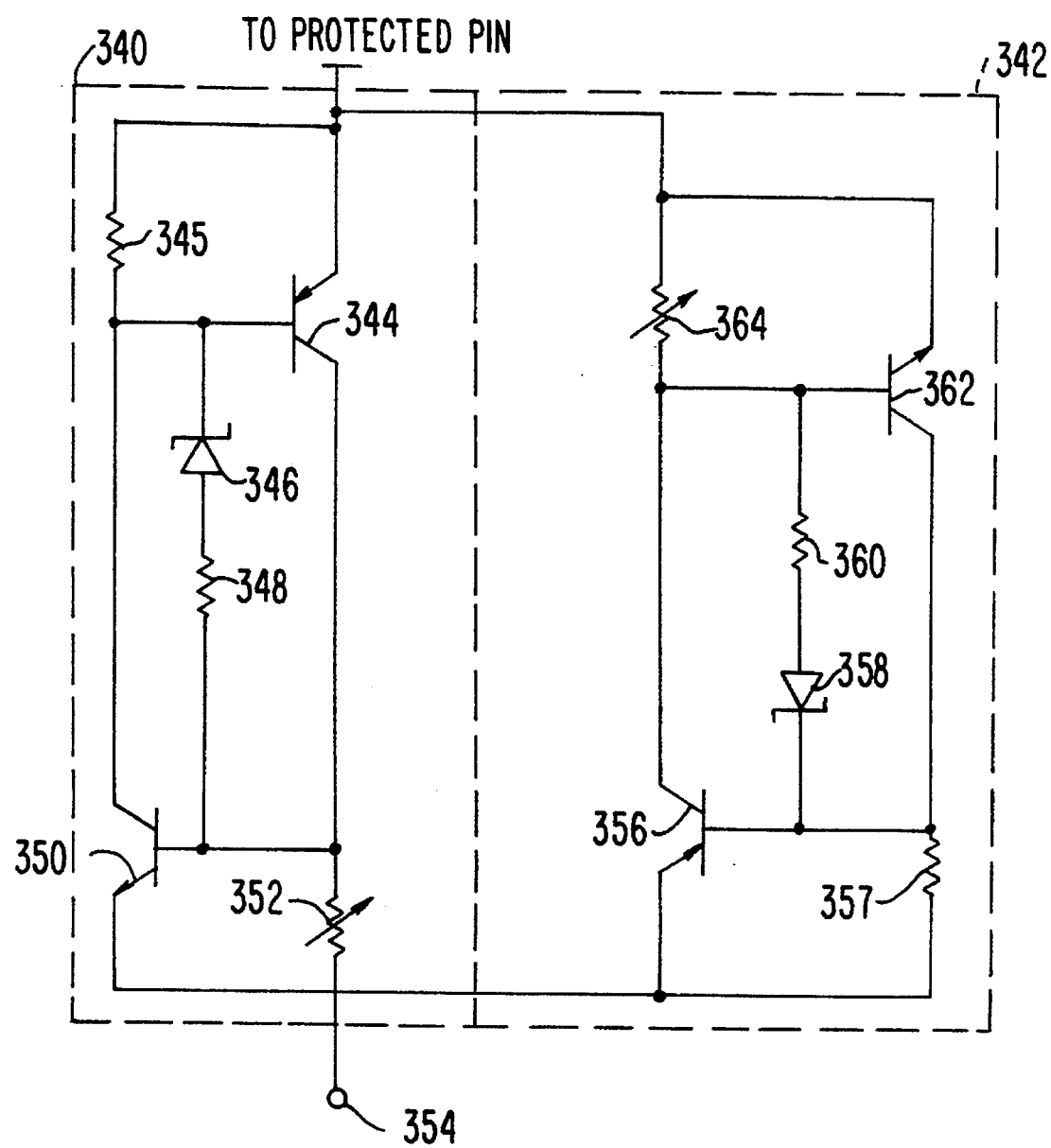
FIG. 9 is a schematic diagram of a pair of four-layer devices provided by the ESD protection circuit shown in FIGS. 8a and 8b in accordance with the principles of the present invention.

Turning now to FIG. 9, a schematic diagram of a pair of silicon-controlled rectifiers (SCRs) 340 and 342 which are provided by the ESD cell 310 shown in FIGS. 8a and 8b is described. The SCR 340 operates in a similar manner to that described for the SCR 240 of FIG. 7 to provide protection against positive-going ESD potentials. More precisely, the SCR 340 includes a pnp transistor 344, a resistor 345, a zener diode 346, a resistor 348, an npn transistor 350, and a resistor 352.

When an ESD potential applied to the protected pin causes a voltage to appear across the zener diode 346 that exceeds its breakdown voltage, the SCR 340 begins to conduct current. The amount of current flowing increases as the voltage across the zener diode 346 increases from its breakdown voltage until the current flowing through the resistor 352 equals the breakdown current. Once the breakdown current is reached, the transistors 344 and 350 turn on causing the SCR 340 to begin to enter its low impedance state. As previously explained, this allows the SCR 340 to discharge the ESD potential without dissipating an excessive amount of power. The variable resistance symbol used for the resistor 352 is again intended to illustrate that for a particular application, the holding current may be adjusted by selecting the number of p-fingers 324 provided in one of the p-base implants 316. The current associated with the ESD potential is not routed to the substrate of the CMOS devices, but rather, to an output node 354 which may be arbitrarily selected to meet the needs of a particular application (e.g., ground).

The ESD cell 310 of FIGS. 8a and 8b also provides the SCR 342, which protects against negative-going high energy electrical transients. The SCR 342 includes a pnp transistor 356, a resistor 357, a zener diode 358, a resistor 360, an npn transistor 362 and a resistor 364 which are formed in a manner that is essentially the same as that described for the SCR 240 of FIG. 7. However, the SCR 342 serves to discharge negative-going high energy electrical transients in the following manner. When the protected pin is brought to a potential below the output node 354, the cathode of the zener diode 358 is pulled high. As the potential applied to the protected pin decreases, the voltage across the zener diode 358 may approach its breakdown voltage. Segment 168 of the curve trace shown in FIG. 4 depicts the action of the SCR 342 until the zener diode 358 reaches its breakdown voltage. In a preferred embodiment, the SCR 342 is designed so that the zener diode 358 has a breakdown voltage of about 20 V.

Once the breakdown voltage of the zener diode 358 is reached, segment 170 of the curve trace of FIG. 4 shows that current starts to flow through the resistors 357, 360 and 364, and that the amount of current flowing significantly increases as the protected pin is brought further below the output node 354. When the current flowing through the resistor 364 reaches the breakdown current, the transistors 356 and 362 turn on, thereby causing the SCR 342 to begin to enter its low impedance state. The SCR 342 can therefore discharge the negative-going high energy electrical transient without dissipating a significant amount of power.

The variable resistor symbol used for the resistor 364 illustrates that the holding current for the SCR 342 may be selected to meet the needs of a particular application, in the same manner as described for the SCR 340.

In the above described embodiments of the present invention, surface area may be conserved by eliminating the large p+ implant (216 in FIG. 6; 322 in FIG. 8). The invention also may be implemented as an ESD protection circuit formed in a p-well by reversing the polarity of the regions in the described n-well embodiments.

Thus, a CMOS electrostatic discharge circuit which provides protection against large ESD transients and which allows for convenient adjustment of the holding current and routing of ESD current to an arbitrary point other than the CMOS substrate is provided. One skilled in the art will appreciate that the present invention can be practiced by other than the described embodiments, which are presented for purposes of illustration and not of limitation, and the present invention is limited only by the claims which follow.

What is claimed is:

1. In an integrated circuit, an electrostatic discharge (ESD) cell for discharging ESD potentials of at least a first polarity applied to a protected terminal of CMOS devices formed within the integrated circuit, the CMOS devices being formed within a substrate of a first conductivity type, the ESD cell comprising:

a well region of a second conductivity type formed within the substrate and defining a first resistor;

a base region of the first conductivity type formed within the well region, the base region defining a second resistor, the base of a first transistor and the collector of a second transistor;

a field region of the first conductivity type formed within the well region having an edge in contact with the base region, the field region defining a third resistor having a first end coupled to a first end of the second resistor and to the base of the first transistor;

a first region of the first conductivity type formed within the well region for providing an ohmic contact to the protected terminal and for providing, in combination with the well region, an emitter-base junction of the second transistor coupled to the protected terminal;

a second region of the second conductivity type formed within the well region and substantially in contact with the field region, the second region forming, in combination with the field region, a zener diode having a cathode coupled to the base of the second transistor and an anode coupled to a second end of the third resistor;

a third region of the second conductivity type formed within the base region, the third region defining an emitter of the first transistor, the emitter being coupled to a second end of the second resistor;

a fourth region of the first conductivity type formed within the base region, the fourth region being electrically shorted to the base region for providing an ohmic contact for an output terminal through which current associated with an ESD potential applied to the protected terminal is routed; and an electrically conductive path coupling the third region and the fourth region, whereby, a potential of sufficient magnitude applied to the protected terminal induces a potential across the zener diode which, when greater than a breakdown voltage of the zener diode causes current to flow through the first, second and third resistors, the current causing potentials to appear across the first and second resistors which, when of sufficient magnitude, cause the second and first transistors respectively to turn on, thereby causing the ESD cell to transition from a high impedance state to a low impedance state to discharge the potential applied to the protected terminal with minimal power dissipation.

2. The ESD cell of claim 1 further comprising a plurality of fourth regions of the first conductivity type which lower the resistance of the second resistor, thereby increasing the amount of current required to turn on the first transistor.

3. The ESD cell of claim 2 further comprising a plurality of third regions of the second conductivity type interposed between the plurality of fourth regions of the first conductivity type.

4. The ESD cell of claim 3, wherein the electrically conductive path commonly couples the plurality of fourth regions and third regions.

5. The ESD cell of claim 1 wherein the zener diode has a breakdown voltage of about 20 V.

6. The ESD cell of claim 1 further comprising means for discharging ESD potentials of a second polarity.

7. In an integrated circuit, an electrostatic discharge (ESD) cell for discharging ESD potentials applied to a protected terminal of CMOS devices formed within the integrated circuit, the CMOS devices being formed within a substrate of a first conductivity type, the ESD cell comprising:

a well region of a second conductivity type formed within the substrate and defining a first resistor and a second resistor;

a first base region of the first conductivity type formed within the well region, the base region defining a third resistor, the base of a first transistor and the collector of a second transistor;

a second base region of the first conductivity type formed within the well region, the second base region defining a fourth resistor, the base of a third transistor and the collector of a fourth transistor;

a field region of the first conductivity type formed within the well region, the field region having portions in contact with the first and second base regions, the field region defining a fifth resistor having a first end coupled to a first end of the third resistor and to the base of the first transistor, and defining a sixth resistor having a first end coupled to a first end of the fourth resistor and to the base of the third transistor;

a first region of the second conductivity type formed within the well region and substantially in contact with the field region, the first region forming, in combination with the field region, a first zener diode having a cathode coupled to the base of the second transistor and an anode coupled to a second end of the fifth resistor, and a second zener diode having a cathode coupled to the base of the fourth transistor and an anode coupled to a second end of the sixth resistor;

a second region of the first conductivity type formed within the second base region for providing an ohmic contact to the protected terminal and for providing, in combination with the well region, an emitter-base junction of the second transistor coupled to the protected terminal;

a third region of the second conductivity type formed within the first base region, the third region defining an emitter of the first transistor, the emitter being coupled to a second end of the second resistor;

a fourth region of the first conductivity type formed within the first base region, the fourth region being electrically shorted to the first base region for providing an ohmic contact for an output terminal through which current associated with an ESD potential is routed, and for providing, in combination with the well region, an emitter-base junction of the fourth transistor coupled to the output terminal;

a fifth region of the second conductivity type formed within the second base region, the fifth region defining an emitter of the third transistor, the emitter being coupled to a second end of the fourth resistor;

a first electrically conductive path coupling the third region and the fourth region; and a second electrically conductive path coupling the second region and the fifth region, whereby, a potential of sufficient magnitude of a first polarity applied to the protected terminal induces a potential across the first zener diode which, when greater than a breakdown voltage of the first zener diode causes current to flow through the first, third and fifth resistors, the current causing potentials to appear across the first and third resistors which, when of sufficient magnitude, cause the second and first transistors respectively to turn on to discharge the potential of the first polarity applied to the protected terminal with minimal power dissipation, and whereby, a potential of sufficient magnitude of a second polarity applied to the protected terminal induces a potential across the second zener diode which, when greater than a breakdown voltage of the second zener diode causes current to flow through the second, fourth and sixth resistors, the current causing potentials to appear across the second and fourth resistors which, when of sufficient magnitude, cause the fourth and third transistors respectively to turn on to discharge the potential of the second polarity applied to the protected terminal with minimal power dissipation.

8. The ESD cell of claim 7 further comprising a plurality of fourth regions of the first conductivity type which lower the resistance of the third resistor, thereby increasing the amount of current required to turn on the first transistor.

9. The ESD cell of claim 8 further comprising a plurality Of third regions of the second conductivity type interposed between the plurality of fourth regions of the first conductivity type.

10. The ESD cell of claim 9, wherein the first electrically conductive path commonly couples the plurality of third regions-and fourth regions.

11. The ESD cell of claim 7 further comprising a plurality of second regions of the first conductivity type which lower the resistance of the fourth resistor, thereby increasing the amount of current required to turn on the third transistor.

12. The ESD cell of claim 11 further comprising a plurality of fifth regions of the second conductivity type interposed between the plurality of second regions of the first conductivity type.

13. The ESD cell of claim 12, wherein the second electrically conductive path commonly couples the plurality of second regions and fifth regions.

14. The ESD cell of claim 7, wherein the first zener diode and the second zener diode each have a breakdown voltage of about 20 V.

* * * * *

UNITED STATES PATENT AND TRADEMARK OFFICE
CERTIFICATE OF CORRECTION

PATENT NO. : 5,485,024
DATED : January 16, 1996
INVENTOR(S) : Robert L. Reay

It is certified that error appears in the above-indentified patent and that said Letters Patent is hereby corrected as shown below:

Cover Page, item [56] Other Publication,
                Change "Goldtharp" to -- Goldthorp --.

Abstract, line 7, Change "tile" to -- the --.

| Column | Line | |
|---|---|---|
| 7 | 57 | Change "FIG. 1" TO -- FIG. 5 --. |
| 14 | 47 | Change "Of" to -- of --. |
| 14 | 52 | Change "regions-and" to -- regions and --. |

Signed and Sealed this

Seventeenth Day of August, 1999

Attest:

Q. TODD DICKINSON

*Attesting Officer*      *Acting Commissioner of Patents and Trademarks*